United States Patent [19]
Hutton

[11] Patent Number: 5,572,141
[45] Date of Patent: Nov. 5, 1996

[54] MEMORY METAL HOT PLUG CONNECTOR AND METHOD

[75] Inventor: Edward W. Hutton, Columbia, S.C.

[73] Assignee: AT&T Global Information Solutions Company, Dayton, Ohio

[21] Appl. No.: 207,999

[22] Filed: Mar. 9, 1994

[51] Int. Cl.$^6$ .............................. G01R 1/04; H01R 13/15
[52] U.S. Cl. ........................ 324/757; 439/259; 439/260; 324/73.1
[58] Field of Search ................................ 324/757–762, 324/73.1, 754; 439/259–267

[56] References Cited

U.S. PATENT DOCUMENTS

| | | | |
|---|---|---|---|
| 4,465,972 | 8/1984 | Sokolich | 324/754 |
| 4,747,783 | 5/1988 | Bellamy et al. | 439/59 |
| 4,819,149 | 4/1989 | Sanik et al. | 364/132 |
| 4,941,835 | 7/1990 | Lasmayoux et al. | 439/152 |
| 4,999,787 | 3/1991 | McNally et al. | 364/514 |
| 5,098,309 | 3/1992 | Deak et al. | 439/260 |
| 5,124,638 | 6/1992 | Winroth | 324/73.1 |
| 5,157,771 | 10/1992 | Losi et al. | 395/325 |
| 5,210,855 | 5/1993 | Bartol | 395/500 |
| 5,220,211 | 6/1993 | Christopher et al. | 307/443 |

Primary Examiner—Kenneth A. Wieder
Assistant Examiner—Barry C. Bowser
Attorney, Agent, or Firm—Paul W. Martin

[57] ABSTRACT

A memory metal hot plug connector apparatus and method which provide a physical lock that prevents removal of a circuit card from a system board until power and system functional signals have been electrically disconnected. The memory metal in the connector releases the physical lock when heated. A power supply interface controller issues commands to connect and disconnect power to the circuit card and to heaters associated with the memory metal connectors. A test signal circuit provides JTAG standard signals for connecting and disconnecting system functional signals. Methods for connecting and disconnecting the circuit card are also disclosed.

6 Claims, 4 Drawing Sheets

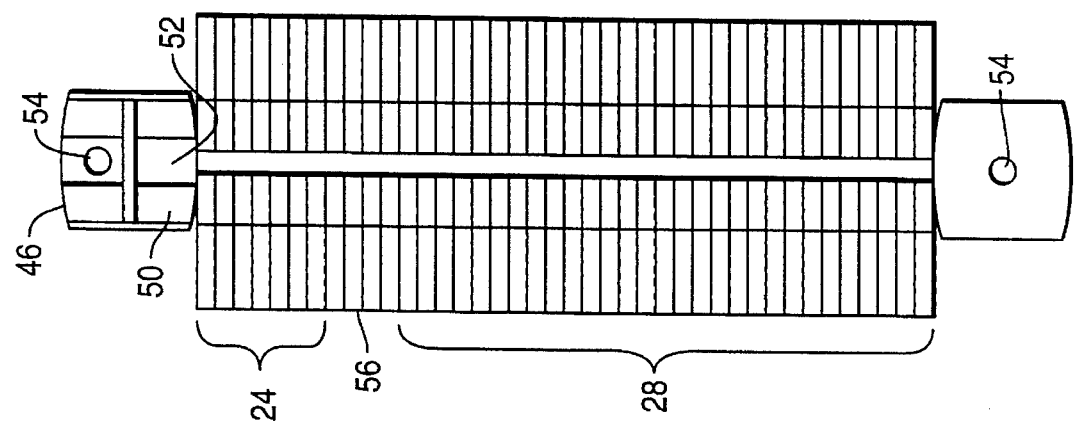
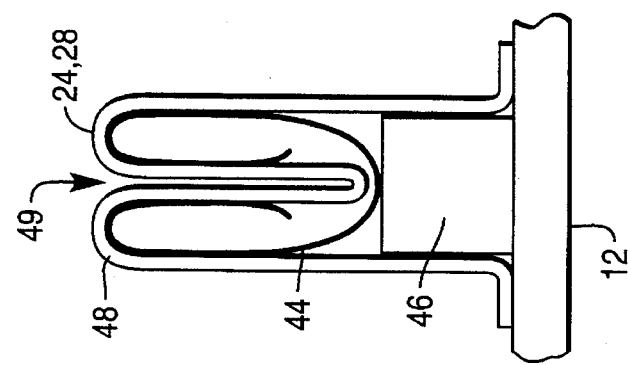
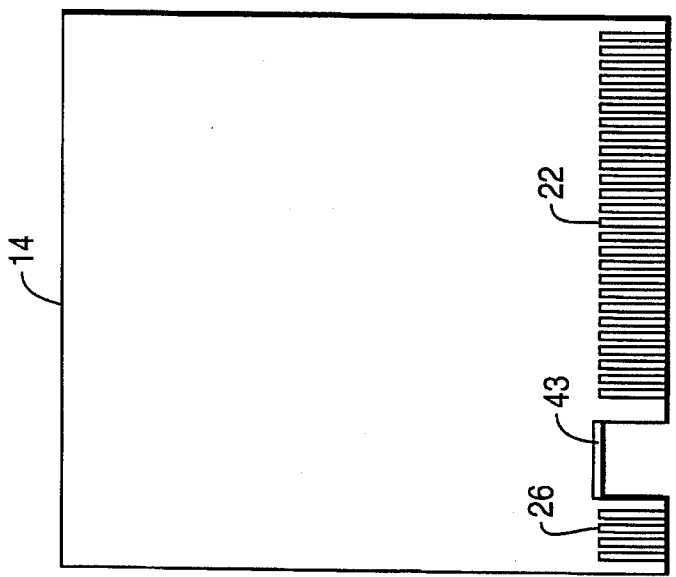

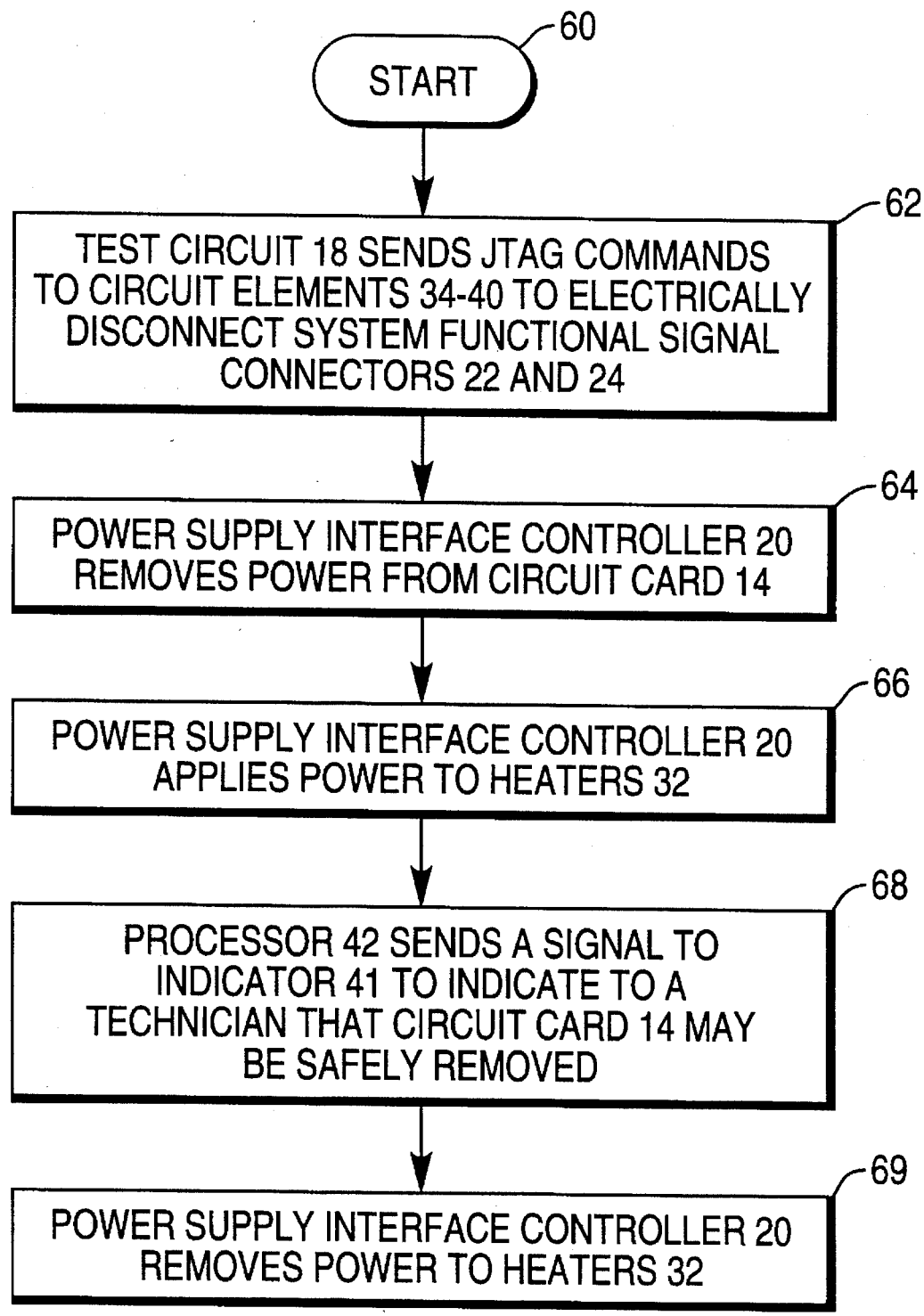

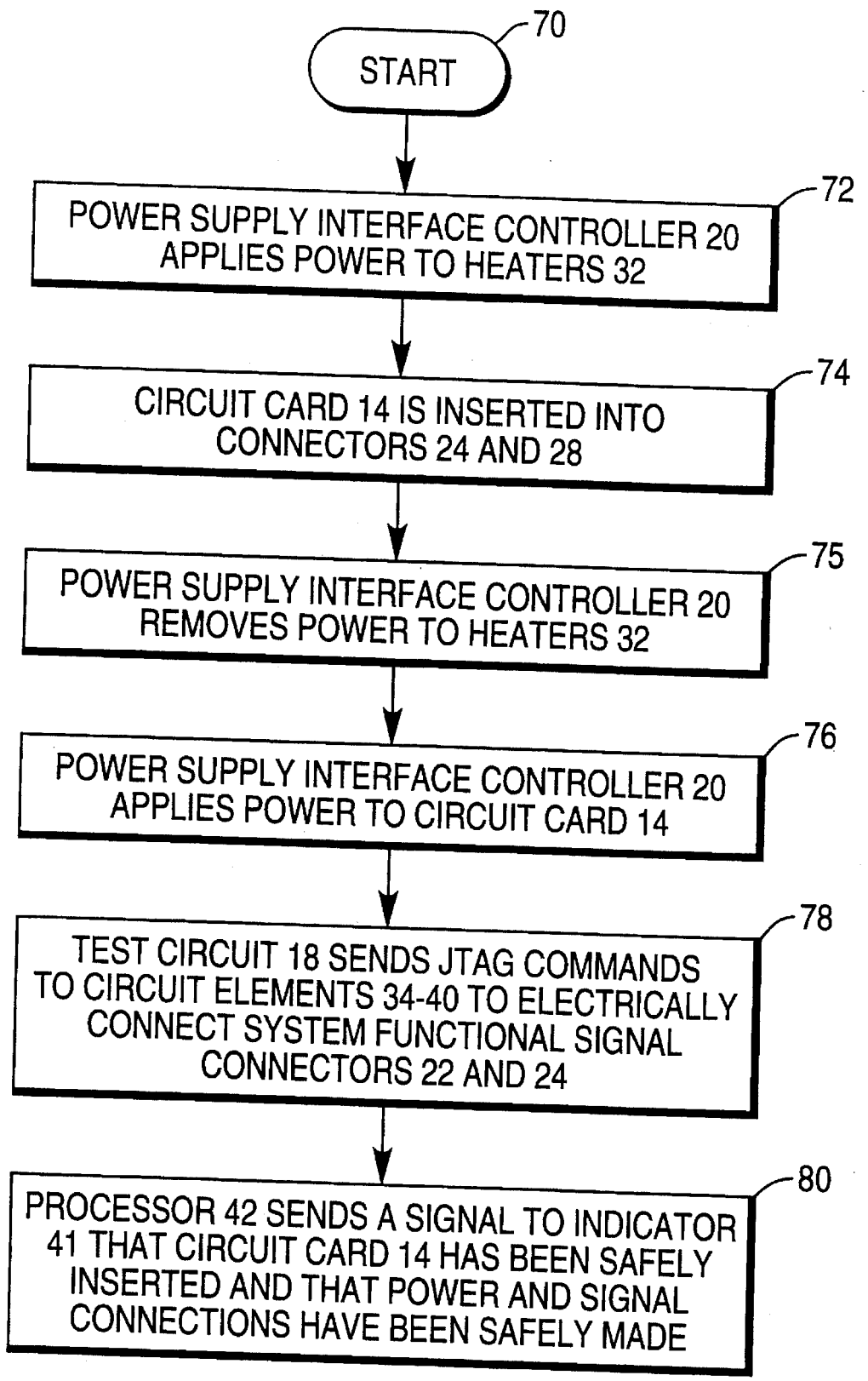

MEMORY METAL HOT PLUG CONNECTOR AND METHOD

BACKGROUND OF THE INVENTION

The present invention relates to computer systems, and more specifically to a memory metal hot plug connector and method for removing circuit cards from a live computer system.

The term "hot plug" is known in the computer arts to denote a method for removing circuit cards from live systems. Various hot plug methods are known in the art. One such method is to connect an umbilical cable for precharging and discharging a circuit card. Another method uses connector pins of different lengths. Both methods are mechanically complex and provide no safety mechanism for preventing an operator from removing a circuit card before power has been removed and the card discharged.

Therefore, it would be desirable to provide a hot plug connector and method which are mechanically simple and which offer a backup safety feature.

SUMMARY OF THE INVENTION

In accordance with the teachings of the present invention, a memory metal hot plug connector and method are provided. The memory metal in the connector changes state when heated to release a physical lock which prevents removal of a first connector on a first printed circuit board from the memory metal connector on a second printed circuit board. A heater on the second printed circuit board heats the memory metal connector to unlock the first connector of the first printed circuit board.

The second printed circuit board includes a power controller for disconnecting power to the first printed circuit board when the first printed circuit board is to be removed and to apply power to the first printed circuit board after it has been installed.

A test circuit provides JTAG standard signals to a signal switch on the first printed circuit board to disconnect and connect system functional signals.

The first and second printed circuit boards also include power and test connectors through which power and test signals flow.

A method for disconnecting the first printed circuit board from the second printed circuit board while the second board is powered is also disclosed. JTAG command signals are sent from the test circuit to electrically disconnect the functional signal connectors on the first and second circuit boards through which system functional signals flow. The power supply interface controller removes power from the first printed circuit board. The power supply interface controller applies power to the memory metal heaters. After a predetermined time delay to allow energy-storing components on the first printed circuit board to discharge, a processor on the second printed circuit board provides an indication to a maintenance person to remove the first printed circuit board.

A method for connecting the first printed circuit board begins with the power supply interface controller applying power to the memory metal heaters. The first circuit board is inserted into the memory metal connector of the second printed circuit board. The power supply interface controller applies power for precharging the first printed circuit board. Finally, JTAG command signals are sent from the test circuit to electrically connect the system functional connectors.

It is accordingly an object of the present invention to provide a memory metal hot plug connector and method for removing circuit cards from live computer systems.

It is another object of the present invention to provide a memory metal hot plug connector and method which include a safety interlock for preventing removal of circuit cards before a removal command sequence is executed.

It is another object of the present invention to provide a memory metal hot plug connector and method which are relatively less complex than known hot plug methods.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings, in which:

FIGS. 2A–C are views of the connectors of the circuit card and the corresponding connectors of the system board;

FIG. 3 is a flow diagram illustrating the memory metal hot plug disconnect method of the present invention; and FIG. 4 is a flow diagram illustrating the memory metal hot plug insertion method of the present invention.

DETAILED DESCRIPTION OF THE PREFERRED EMBODIMENT

Figure 1:
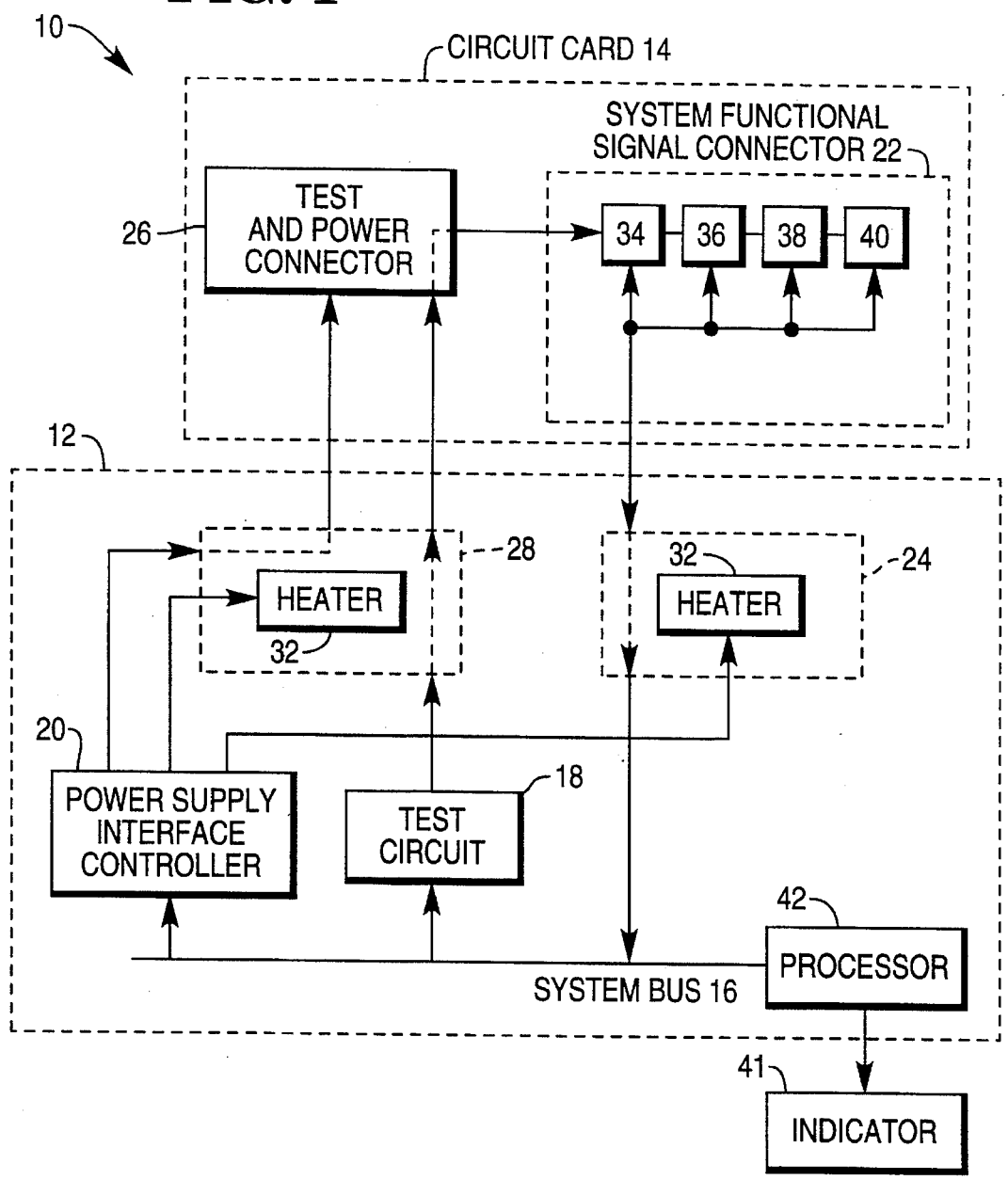
FIG. 1 is a block diagram of a system employing the memory metal hot plug connector of the present invention.

Referring now to FIG. 1, computer system 10 includes system board 12, circuit card 14, system bus 16, test circuit 18, and power supply controller 20.

System board 12 is a "mother board" and contains most of the computer system components, including system bus 16.

Circuit card 14 contains peripheral computer components and attaches to system board 12 through two pairs of connectors. System functional signal connector 22 is located on circuit card 14 and attaches to system functional signal connector 24 on system board 12. System functional signal connector 24 couples to system bus 16. Test and power connector 26 is located on circuit card 14 and attaches to test and power connector 28.

Connectors 24 and 28 include a memory metal which when heated by thermal heaters 32 changes state to unlock circuit card 14. Thus, circuit card 14 cannot be removed without applying power to thermal heaters 32.

A memory metal is a material which undergoes a reversible martensitic transformation. Memory metal materials are also known as phase change alloys. Memory metals may behave in different ways. The behavior of the memory metal used in the present invention preferably changes state so as to release circuit card 14 when heated to the phase change temperature and to securely grip circuit card 14 at ambient temperatures.

System functional signal connector 22 includes integrated circuit elements 34–40 which are controlled by JTAG boundary-scan signals from test and power connector 26. A discussion of boundary-scan logic and signals can be found in the following publications: (1) IEEE standard 1149.1, entitled, "IEEE Standard Test Access port and Boundary-Scan Architecture", dated May 21, 1990; and (2) "A Standard Test Bus and Boundary Scan Architecture", by Lee Whetsel, TI Technical Journal, July–August 1988. These publications are hereby incorporated by reference.

Circuit elements 34–40 act as switches for interrupting functional signals between circuit card 14 and system bus 16.

System bus 16 provides an electrical path for signals to and from processor 42 to circuit card 14. System bus 16 also provides control signals from processor 42 to test circuit 18 and power supply interface controller 20.

Indicator 41 may be a video monitor which provides messages to a technician indicating that circuit card 14 may be safely removed, or that it has been safely installed.

Test circuit 18 is located on system board 12. Test circuit 18 provides JTAG logical disconnect signals to circuit elements 34–40.

Power supply interface controller 20 issues commands to switching circuitry on printed circuit board 12 to provide power to circuit card 14 and to thermal heaters 32 within connectors 24 and 28.

Turning now to FIGS. 2A–C, connectors 22–28 are shown in more detail. With reference to FIG. 2A, connectors 22 and 26 are standard printed circuit board surface connectors having linear circuit elements of equal length and equal spacing. Connectors 22 and 26 are separated by a gap 43.

With reference to FIGS. 2B and 2C, connectors 24 and 28 include memory metal 44, support member 46, and circuit laminate 48. Here, connectors 24 and 28 are shown as being portions of a single connector unit, although separate units may also be employed. Memory metal 44 is shaped to allow laminate 48 to grab circuit card 14 along its length.

Memory metal rests on support member 46, which is fastened to printed circuit board 12 at both ends through screw holes 54. Support member 46 includes a vertical post 50 containing slot 52 which provides alignment and vertical support to circuit card 14 when inserted.

Circuit laminate 48 is a flexible circuit having a plurality of parallel wires 56 running through it. Circuit laminate 48 covers the inside surfaces of memory metal 44 within gap 49. Wires 56 belonging to connector 22 are connected to the functional signal inputs of elements 34–40 on circuit card 14, while wires 56 belonging to connector 26 connect to the test inputs of elements 34–40 and to power distribution circuitry on card 14.

Turning now to FIG. 3, the method for disconnecting circuit card begins at START 60.

In step 62, JTAG command signals are sent from test circuit 18 to circuit elements 34–40 to electrically disconnect system functional signal connector 22 from system functional system connector 24.

In step 64, power supply interface controller 20 removes power from circuit card 14.

In step 66, after a predetermined time delay to allow energy-storing components on circuit card 14 to discharge, power supply interface controller 20 applies power to heaters 32.

In step 68, processor 42 sends a signal to indicator 41 to provide an indication to the technician that circuit card 14 may be safely removed.

In step 69, power supply interface controller 20 removes power to heaters 32.

Advantageously, the disconnect method of the present invention minimizes damage to both circuit card 14 and system board 12 by ensuring that functional signals and power are disconnected and stored electrical energy and static electricity are discharged.

Turning now to FIG. 4, the method for connecting circuit card 14 begins at START 70.

In step 72, power supply interface controller 20 applies power to heaters 32.

In step 74, circuit card 14 is inserted into system functional signal connectors 24 and 28.

In step 75, power supply interface controller 20 removes power to heaters 32.

In step 76, power supply interface controller 20 applies power to circuit card 14.

In block 78, JTAG command signals are sent from test circuit 18 to circuit elements 34–40 to electrically connect system functional signal connector 22 to system functional signal connector 24.

In step 80, processor 42 sends a signal to indicator 41 to inform the technician that power and signal connections have been safely established and that circuit card is functioning normally.

Although the present invention has been described with particular reference to certain preferred embodiments thereof, variations and modifications of the present invention can be effected within the spirit and scope of the following claims.

What is claimed is:

1. A method for electrically disconnecting a first printed circuit board from a second printed circuit board comprising the steps of:

(a) providing first and second connectors on the first and second printed circuit boards;

(b) issuing test signals from a test circuit on the second printed circuit board through the second connectors to interrupt system functional signal flow through the first connectors;

(c) issuing power control signals from a power controller on the second printed circuit board to disconnect power to the first printed circuit board;

(d) dissipating energy stored by components in the first printed circuit board and static electricity on surfaces of the first printed circuit board; and (e) unlocking the first connectors only after steps (b), (c), and (d) have been completed.

2. A method for disconnecting a first printed circuit board from a second printed circuit board comprising the steps of:

(a) heating a connector on the second printed circuit board, which includes
   a flexible circuit which has circuit traces and which forms a generally U-shaped groove containing an edge connector of the first printed circuit board, and
   a memory metal,
to a phase change temperature of the memory metal to widen the U-shaped groove; and (b) removing the edge connector on the first printed circuit board from the widened U-shape groove in the connector on the second printed circuit board.

3. A method for connecting a first printed circuit board to a second printed circuit board comprising the steps of:

(a) heating a connector on the second printed circuit board, which includes
   a flexible circuit which has circuit traces and which forms a generally U-shaped groove for containing an edge connector of the first printed circuit board, and
   a memory metal,
to a phase change temperature of the memory metal to widen the U-shaped groove; and (b) inserting the edge connector on the first printed circuit board into the widened U-shape groove in the connector on the second printed circuit board; and (c) cooling the connector on the second printed circuit board to a temperature below the phase change temperature.

4. The method as recited in claim 6, wherein step (b) comprises the substep of:

(b-1) issuing JTAG signals from a JTAG test circuit on the second printed circuit board through the second connectors to interrupt system functional signal flow through the first connectors.

5. A method for disconnecting a first printed circuit board from a second printed circuit board comprising the steps of:

(a) providing a connector on each of the first and second printed circuit boards, wherein the connector on the first printed circuit board includes an edge of the first printed circuit board, and wherein the connector on the second printed circuit board includes a flexible circuit which has circuit traces and which form a generally U-shaped groove containing the edge of the first printed circuit board, and a memory metal;

(b) issuing test signals from a test circuit on the second printed circuit board through the connectors to interrupt system functional signal flow through the connectors;

(c) issuing power control signals from a power controller on the second printed circuit board to disconnect power to the first printed circuit board;

(d) dissipating energy stored by components in the first printed circuit board and static electricity on surfaces of the first printed circuit board;

(e) heating the connector on the second printed circuit board to a phase change temperature of the memory metal to widen the U-shaped groove; and (f) removing the edge of the first printed circuit board from the widened U-shape groove in the connector on the second printed circuit board.

6. A method for connecting a first printed circuit board to a second printed circuit board comprising the steps of:

(a) heating a connector on the second printed circuit board, which includes a flexible circuit which has circuit traces and which forms a generally U-shaped groove for containing an edge connector of the first printed circuit board, and a memory metal, to a phase change temperature of the memory metal to widen the U-shaped groove;

(b) inserting the edge connector on the first printed circuit board into the widened U-shape groove in the connector on the second printed circuit board;

(c) cooling the connector on the second printed circuit board to a temperature below the phase change temperature;

(d) issuing power control signals from a power controller on the second printed circuit board to connect power to the first printed circuit board;

(e) issuing test signals from a test circuit on the second printed circuit board through the connectors to connect system functional signal flow through the connectors; and (f) indicating that power and system functional signal connections have been made.

\* \* \* \* \*